(12) United States Patent
Qing et al.

(10) Patent No.: US 9,136,013 B2
(45) Date of Patent: Sep. 15, 2015

(54) SHIFT REGISTER, GATE DRIVER, AND DISPLAY DEVICE

(75) Inventors: Haigang Qing, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 13/704,295

(22) PCT Filed: Sep. 13, 2012

(86) PCT No.: PCT/CN2012/081356
§ 371 (c)(1),
(2), (4) Date: Dec. 14, 2012

(87) PCT Pub. No.: WO2013/075536
PCT Pub. Date: May 30, 2013

(65) Prior Publication Data
US 2013/0136224 A1    May 30, 2013

(51) Int. Cl.
*G11C 19/00* (2006.01)
*G11C 19/28* (2006.01)
*H03K 3/012* (2006.01)
*H03K 3/356* (2006.01)
*H03K 3/037* (2006.01)
*G09G 3/36* (2006.01)

(52) U.S. Cl.
CPC .............. *G11C 19/28* (2013.01); *G09G 3/3677* (2013.01); *H03K 3/012* (2013.01); *H03K 3/0375* (2013.01); *H03K 3/356* (2013.01); *G09G 2310/0286* (2013.01)

(58) Field of Classification Search
None
See application file for complete search history.

(56) References Cited

U.S. PATENT DOCUMENTS 8,120,404 B2 *   2/2012  Arora et al. ................. 327/202
8,558,777 B2 *  10/2013  Jang et al. ................... 345/100
(Continued)

FOREIGN PATENT DOCUMENTS

CN    1648972 A    8/2005
CN    1716778 A    1/2006
(Continued)

OTHER PUBLICATIONS

International Search Report; dated Dec. 20, 2012; PCT/CN2012/081356.
(Continued)

*Primary Examiner* — Tuan T Lam
(74) *Attorney, Agent, or Firm* — Ladas & Parry LLP

(57) ABSTRACT

The present invention relates to a display device field, and provides a shift register, a gate driver, and a display device. The shift register comprises an input programming unit, a latch unit, an output programming unit and an inverting output unit; the input programming unit is connected to the input end of the latch unit to program the input end of the latch unit; the latch unit is used for latching the output signal, and a non-inverting output end and an inverting output end of the latch unit are connected through the output programming unit; the output programming unit is connected to the output end of the latch unit to program the output end of the latch unit; the inverting output unit is connected to the inverting output end of the latch unit and is used for generating a inverting output signal of the shift register.

15 Claims, 5 Drawing Sheets

(56) References Cited

U.S. PATENT DOCUMENTS

| | | | |
|---|---|---|---|
| 2005/0083093 A1* | 4/2005 | Rhee | 327/218 |
| 2005/0184784 A1 | 8/2005 | Washio et al. | |
| 2006/0087355 A1* | 4/2006 | Petersen | 327/208 |
| 2007/0001990 A1 | 1/2007 | Lee et al. | |
| 2007/0258557 A1* | 11/2007 | Tseng et al. | 377/64 |
| 2008/0192883 A1* | 8/2008 | Chang et al. | 377/64 |
| 2008/0218234 A1* | 9/2008 | Jain | 327/202 |
| 2009/0110379 A1* | 4/2009 | McGhin et al. | 392/485 |
| 2012/0092311 A1 | 4/2012 | Ohkawa et al. | |
| 2012/0113088 A1* | 5/2012 | Han et al. | 345/212 |
| 2012/0269316 A1* | 10/2012 | Jang et al. | 377/75 |
| 2013/0170607 A1* | 7/2013 | Matsui | 377/77 |

FOREIGN PATENT DOCUMENTS

| | | |
|---|---|---|
| CN | 1892783 A | 1/2007 |
| CN | 102654968 A | 9/2012 |
| JP | 2010-049768 A | 3/2010 |
| WO | 2010/146753 A1 | 12/2010 |

OTHER PUBLICATIONS

First Chinese Office Action dated Feb. 18, 2014; Appln. No. 201110382100.1.

International Preliminary Report on Patentability dated May 27, 2014; PCT/CN2012/081356.

Second Chinese Office Action dated Jun. 18, 2014; Appln. No. 201110382100.1.

* cited by examiner

US 9,136,013 B2

SHIFT REGISTER, GATE DRIVER, AND DISPLAY DEVICE

FIELD OF INVENTION

The present invention relates to a display device field, and in particular, relates to a shift register, a gate driver, and a display device.

BACKGROUND

In a TFT-LCD (Thin Film Transistor-Liquid Crystal Display), each pixel unit has its corresponding thin-film transistor on the array substrate. The gate of the thin-film transistor is connected to the scan line (also called the row-scan line) in the horizontal direction, the drain is connected to the data line in the vertical direction, and the source is connected to the pixel electrode. When the display performs display, if a sufficient positive voltage is applied to a certain scan line in the horizontal direction, the control through the gate of the thin-film transistor will make all the thin-film transistors in the row turn on, and at this time the pixel electrodes corresponding to the thin-film transistors in the row will be connected to the data line in the vertical direction, thereby writing the display signal voltage transmitting on the data line into the pixel electrode, and further controlling the liquid crystals in the pixel unit area corresponding to the pixel electrode to reach different transparencies so as to achieve control of the gray-scale and/or color displayed by the pixel unit.

Currently, the driving circuits of a TFT-LCD panel are mainly realized through bonding ICs (Integrated Circuit) to the outer edge of the panel, and the ICs are commonly manufactured by using silicon chips made of CMOS. Because the bonding ICs need to occupy a certain area and meanwhile the circuit design when the ICs are connected also occupies a certain area, the panel integration achieved by this way is not very high, also the occupied area thereof is large, both of which are disadvantageous to realize the high resolution and narrow frames of the display apparatus.

To solve this problem, there emerges the GOA (Gate Drive on Array) technique, in which the gate driver ICs of the TFT-LCD are directly and integratedly manufactured on the array substrate to substitute the driver chips made of silicon chips and bonded to the outer edge of the panel. Since the driver ICs can be directly manufactured on the array substrate by using this technique, and there is no need to bond ICs and wire around the panel. The production process of the panel is simplified, the product cost is reduced, and meanwhile the integration of the TFT-LCD panel is improved so as to realize the narrow border and the high resolution of the panel.

In the prior art, a conventional a-Si (amorphous Silicon) GOA circuit is usually implemented by using a pre-charge and boost circuit mechanism, and the shift register circuit thereof (Thomason circuit) is shown as in FIG. 1. When operating, the circuit makes use of STV signal (starting signal) phase to perform precharge (point P in the figure), thus achieving a shift output of a high-level square wave. This circuit includes four transistors T1-T4, two capacitors C1 and C2, an input signal for the previous stage Input(n−1), two clock signals CLK1 and CLK2, a reset signal for the next stage Reset(n+1), and the row output signal Row(n) formed under control of voltage Voff.

A latch is usually employed to compose an inverter in a conventional LTPS (Low Temperature Poly-silicon) GOA circuit, and at the same time transmission gates are used to perform control, a typical shift register circuit thereof is shown in FIG. 2. The circuit includes two latches (in the prior art, a latch is constituted of two inverters in series whose outputs are treated as the inputs of the registers, therefore four inverters included in the circuit), wherein one latch being used for programming and another latch being used for latching output signal. When operating, under control of two clock signals elk and clk_ as well as reset signal reset, the GOA circuit controls the programming of the latch and the output signal Q for the input signal D through the transmission gate.

It can be seen from the circuit structure shown in FIG. 1 and FIG. 2 that, GOA circuit of the prior art is relatively complex. Two capacitors are needed in the circuit shown in FIG. 1, which leads to the circuit occupying a relatively large space, and this is disadvantageous to narrow the border of a panel. At the same time, there is a floating status (a unconnected status in which the potential is uncertain) in the circuit, which leads to a lot of noise in the output level; 4 transmission gates and 2 latches are needed in the conventional shift register circuit as shown in FIG. 2, so the circuit is complex, and the complicated CMOS process, the cost of which is very high, must be used to implement it.

SUMMARY

(1) Technical Problem that Need to be Solved

In response to the above disadvantages and in order to solve the problem of structure complexity of the shift register in GOA circuit in the prior art, the present invention provides a shift register, a gate driver, and a display device, which makes of a single latch unit to achieve the function of signal shift output and thus simplifies the structure of the shift register and related devices.

(2) Technical Solutions

In order to solve the above-mentioned problem, the present invention adopts a technical solution as follows:

In one aspect, the present invention provides a shift register, said shift register comprising: an input programming unit, a latch unit, an output programming unit and an inverting output unit; wherein the input programming unit is connected to an input end of the latch unit to program the input end of the latch unit; the latch unit is used for latching the output signal, and a non-inverting output end and an inverting output end of the latch unit are connected through the output programming unit; the output programming unit is connected to the output end of the latch unit to program the output end of the latch unit; and the inverting output unit is connected to the inverting output end of the latch unit and is used for generating a inverting output signal of the shift register.

Preferably, the latch unit comprises a first inverter and a second inverter connected end to end.

Preferably, the first inverter in the latch unit comprises:
a thirteenth thin-film transistor, the gate thereof serving as the input end of the latch unit, the drain severing as the non-inverting output end of the latch unit, and the source being connected to a digital ground voltage end; and the second inverter comprises:
a tenth thin-film transistor, the gate thereof being connected to the non-inverting output end of the latch unit, the drain serving as the inverting output end of the latch unit, and the source being connected to the digital ground voltage end.

Preferably, the first inverter in the latch unit further comprises:
a twelfth thin-film transistor, the gate and the drain thereof both being connected to the operating voltage end, and the source being connected to the non-inverting output end of the latch unit; and wherein, the second inverter further comprises:

a ninth thin-film transistor, the gate and the drain thereof both being connected to the operating voltage end, and the source being connected to the input end and the inverting output end of the latch unit.

Preferably, the first inverter in the latch unit further comprises:

a twelfth thin-film transistor, the drain thereof being connected to the operating voltage end, and the source being connected to the non-inverting output end of the latch unit; and a eleventh thin-film transistor, the gate and the drain thereof both being connected to the operating voltage end, and the source being connected to the gate of the twelfth thin-film transistor; and wherein the second inverter further comprises:

a ninth thin-film transistor, the drain thereof being connected to the operating voltage end, and the source being connected to the input end and the inverting output end of the latch unit;

an eighth thin-film transistor, the gate and the drain thereof both being connected to the operating voltage end, and the source being connected to the gate of the ninth thin-film transistor. Preferably, the input programming unit comprises a first thin-film transistor, the gate thereof being connected to a first clock signal end, the source being connected to a second input signal end, and the drain being connected to the input end of the latch unit.

Preferably, the output programming unit comprises a second thin-film transistor, a third thin-film transistor, and a fourth thin-film transistor, wherein the gate of the second thin-film transistor being connected to a second clock signal end, the source and the drain being connected to the non-inverting output end of the latch unit and the gate of the third thin-film transistor respectively, the source and the drain of the third thin-film transistor being connected to a first output signal end and the operating voltage end respectively, the gate of the fourth thin-film transistor being connected to the inverting output end of the latch unit, and the source and the drain being connected to the digital ground voltage end and the first output signal end respectively.

Preferably, the output programming unit further comprises: a fifth thin-film transistor, the gate thereof being connected to a first input signal end, and the source and the drain being connected to the digital ground voltage end and the first output signal end respectively.

Preferably, the inverting output unit comprises: a sixth thin-film transistor, the gate thereof being connected to the second input signal end, and the source and the drain being connected to the inverting output end and a second output signal end of the latch unit.

Preferably, the inverting output unit further comprises: a seventh thin-film transistor, the gate thereof being connected to the first input signal end, and the source and the drain being connected to the operating voltage end and the second output signal end respectively.

Preferably, the thin-film transistor therein is an N-type thin-film transistor and/or a P-type thin-film transistor.

In another aspect, the present invention further provides a gate driver, comprising a plurality of cascaded shift registers stated above.

Preferably, a first input signal end of the first-stage shift register is connected to the initial starting signal, and a second input signal end is connected to the inverting signal of the starting signal.

Except for the first-stage shift register, the first input signal ends of the shift registers for the other stages are connected to the first output signal end of the previous-stage shift register, and the second input signal end is connected to the second output signal end of the previous-stage shift register.

In yet another aspect, the present invention provides a display device, comprising a color film substrate, an array substrate, and a liquid crystal cell, wherein the gate driver stated above is integrated in the array substrate.

(3) Beneficial Effects

In the shift registers and related devices according to the present invention, only one latch unit is used to achieve the function of signal shift output, so the circuit structure is simple, the signal wiring is less, and the GOA circuit formed by the cascade structure thereof occupies a small area, thus further reducing the occupied display area of the display panel, so as to realize the high resolution and narrow border of the display apparatus.

DETAILED DESCRIPTION

The technical solutions according to the embodiments of the present invention will be clearly and completely described hereinafter in conjunction with the accompanying drawings of the embodiments, and apparently the embodiments described are part of but not all of the embodiments of the present invention. Based on the embodiments of the present invention and in the premise that no inventive efforts has been made, all the other embodiments achieved by an ordinary skilled person in the art are within the protection scope of the present invention.

Figure 1:
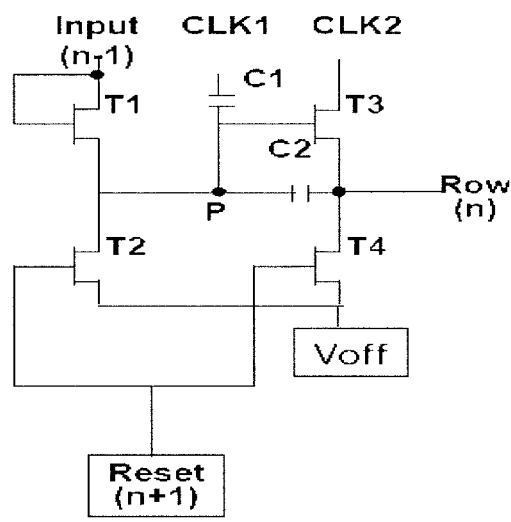
FIG. 1 is a diagram illustrating a basic circuit structure of the shift register of a a-Si GOA circuit in the prior art.
Figure 2:
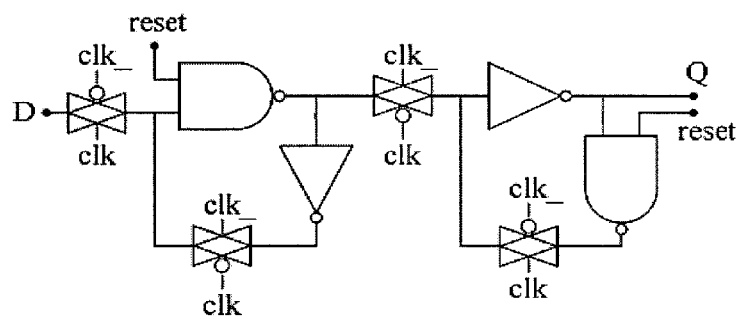
FIG. 2 is a diagram illustrating a basic circuit structure of the shift register of a LTPS GOA circuit in the prior art.
Figure 3:
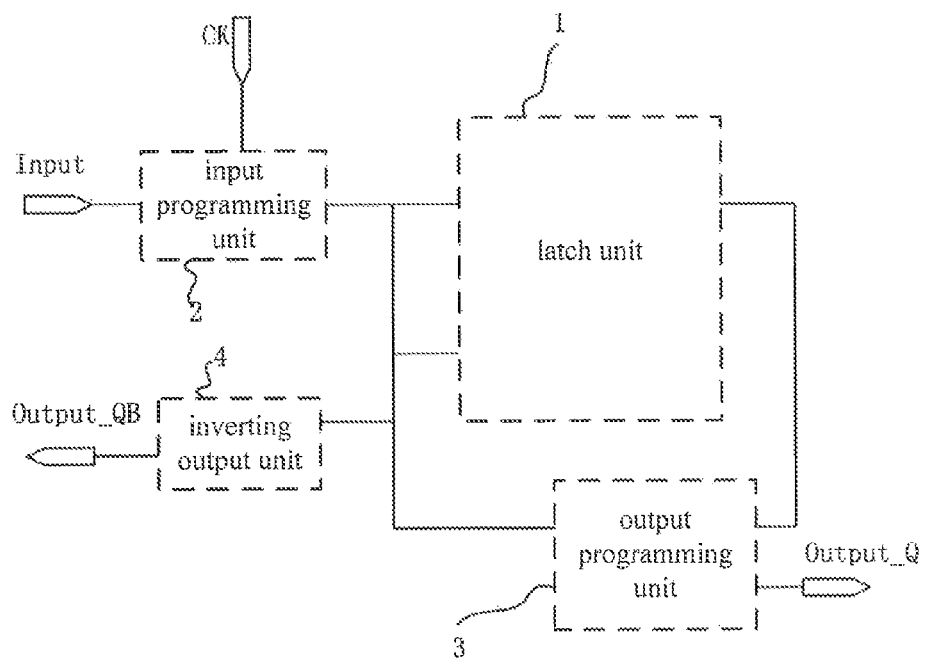
FIG. 3 is a diagram illustrating a basic module structure of the shift register according to the present invention.

In the shift register of the present invention, programming the signals and latching the output signals in the shift register are performed through only one latch unit. Wherein, as shown in FIG. 3, under control of the level signals of clock CK and input Input, the input end of a latch unit 1 is programmed through an input programming unit 2, and the output end of the latch unit 1 is programmed through an output programming unit 3, thus the output signal Output_Q of latch unit 1 are reversed and maintained, and shift output of the signal is realized. In addition, an inverting output unit 4 is further connected to the inverting output end of the latch unit 1 to generate the inverting output signal Output_QB of said shift register to realize cascaded control.

<Embodiment 1>

Figure 4:
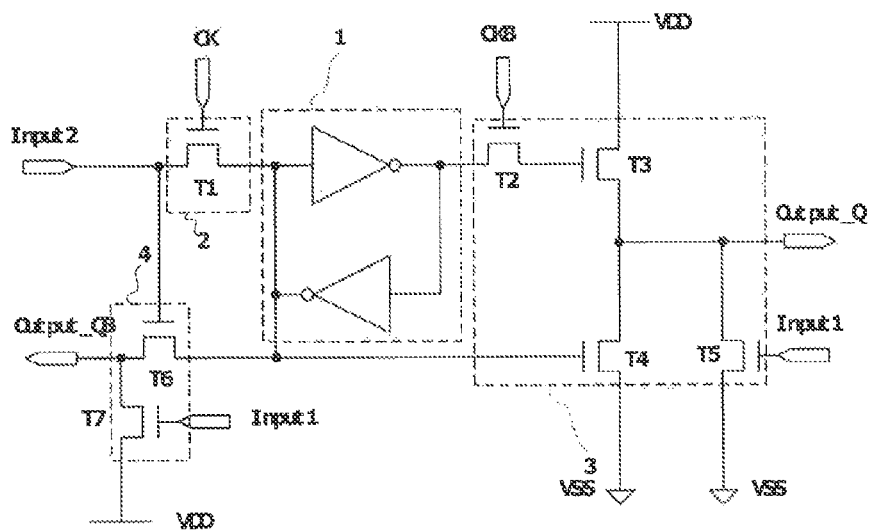
FIG. 4 is a diagram illustrating a basic circuit structure of the shift register constituted of N-type thin-film transistors according to a first embodiment of the present invention.

In particular, the circuit structure of the shift register according to a first embodiment of the present invention is shown in FIG. 4, wherein the shift register mainly comprises a latch unit 1, an input programming unit 2, an output programming unit 3 and an inverting output unit 4. In FIG. 4, the latch unit 1 comprises a first inverter and a second inverter connected end to end, and the other units are thin-film transistors, of which the working voltages are provided by an operating voltage VDD and a digital ground voltage VSS, to receives the control of the two mutually inverted clock signals CK and CKB and the two mutually inverted input signals Input1 and Input2, and output the two mutually inverted output signals Output_Q and Output_QB.

In the first embodiment as shown in FIG. 4, an example in which all the thin-film transistors adopt N-type thin-film transistors is explained for illustration. The input programming unit 2 comprises a first thin-film transistor T1, the output programming unit 3 comprises a second to fifth thin-film transistors T2-T5, and the inverting output unit 4 comprises a sixth and seventh thin-film transistors T6 and T7. Wherein the gate of the first thin-film transistor T1 is connected to a first clock signal CK, and the source and the drain are connected to a second input signal end Input2 and the input end of the latch unit respectively to program the input end of the latch unit under control of the first clock signal CK; the gate of the second thin-film transistor T2 is connected to a second clock signal CKB, and the source and the drain are connected to the non-inverting output end of the latch unit and the gate of the third thin-film transistor T3 respectively; the source and the drain of the third thin-film transistor T3 are connected to the first output signal end Output_Q and operating voltage VDD respectively; the gate of the fourth thin-film transistor T4 is connected to the inverting output end of the latch unit, and the source and the drain are connected to the digital ground voltage VSS and the first output signal end Output_Q; the gate of the fifth thin-film transistor T5 is connected to the first input signal end Input1, and the source and the drain are connected to the digital ground voltage VSS and the first output signal end Output_Q; the second to fifth thin-film transistors T2-T5 program the output end of the latch unit (T2 is controlled by CKB to control the output of the latch unit; T3 is controlled by the non-inverting output of the latch unit to pull up potential of Output_Q of the shift register; T4 is controlled by the inverting output of the latch unit to pull down potential of Output_Q of the shift register; T5 is controlled by Input1 to pull down potential of Output_Q of the shift register; and one can refer to the timing description hereinafter for a detailed working process).

In addition, the gate of the sixth thin-film transistor T6 is connected to the second input signal end Input2, and the source and the drain are respectively connected to the inverting output end of the latch unit and the second output signal end Output_QB, to output Output_QB under control of Input2; the gate of the seventh thin-film transistor T7 is connected to the first input signal end Input1, and the source and the drain are respectively connected to the operating voltage VDD and the second output signal end Output_QB, to pull up the potential of Output_QB of the shift register under control of Input1.

Figure 5:
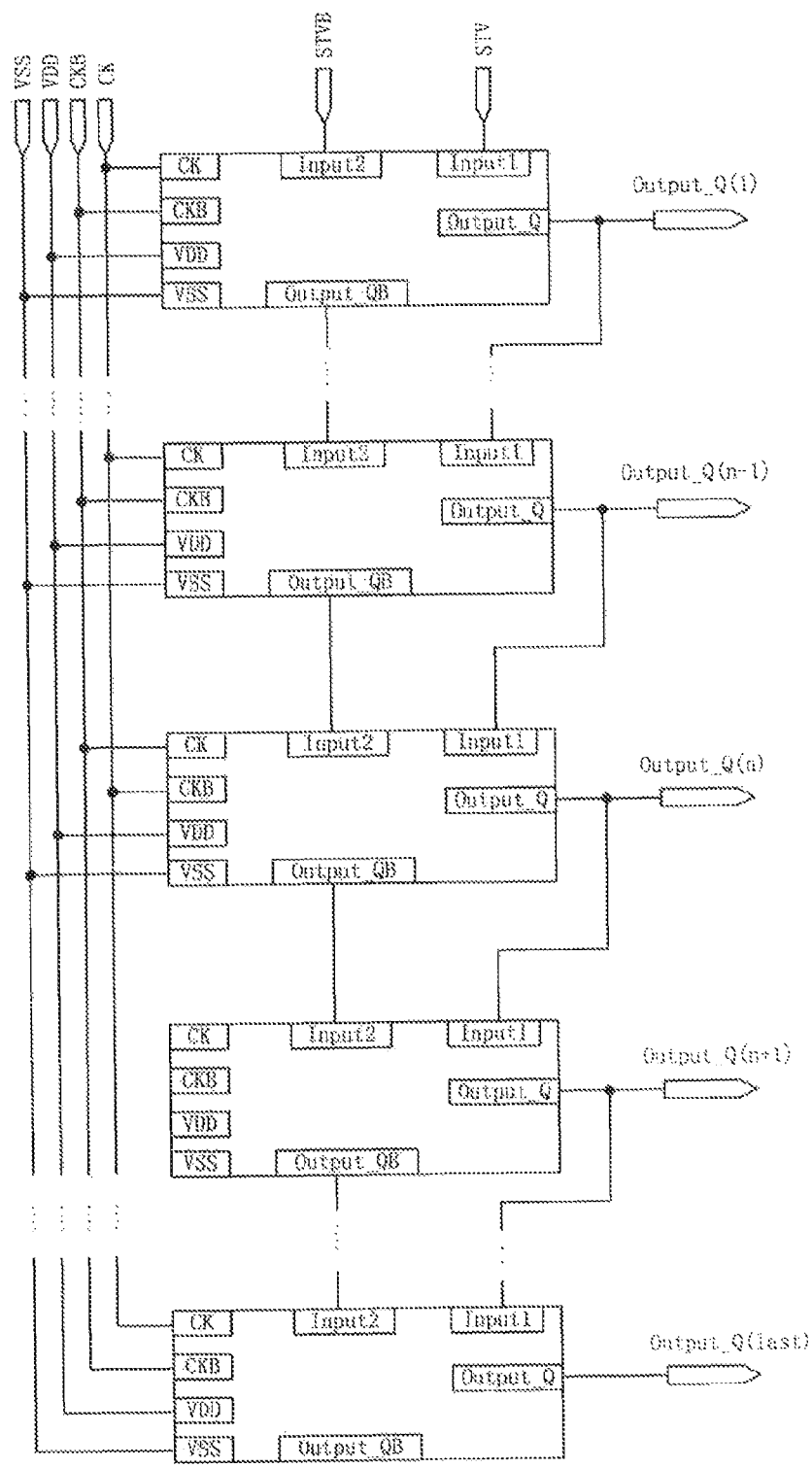
FIG. 5 is a schematic diagram illustrating a basic circuit structure of the shift register in series according to the present invention.

Further, aforementioned shift registers can be connected in cascade into an N-stage gate driver. In cascade structure as shown in FIG. 5, for the N-th stage shift register, a first output signal Output_Q(n) thereof is the output signal of the N-th stage shift register (i.e. the present-stage shift register), a second output signal Output_QB(n) is the inverting output signal of the N-th stage shift register, a second input signal Input2 is the inverting output signal of the previous-stage shift register Output_QB(n−1), and a first input signal Input1 is the output signal of the previous-stage shift register Output_Q (n−1). Particularly, for the first-stage shift register, the first input signal thereof Input1 is the initial row-scanning starting signal STV, and the second input signal Input2 is the inverting signal STVB of the row-scanning starting signal.

Figure 6:
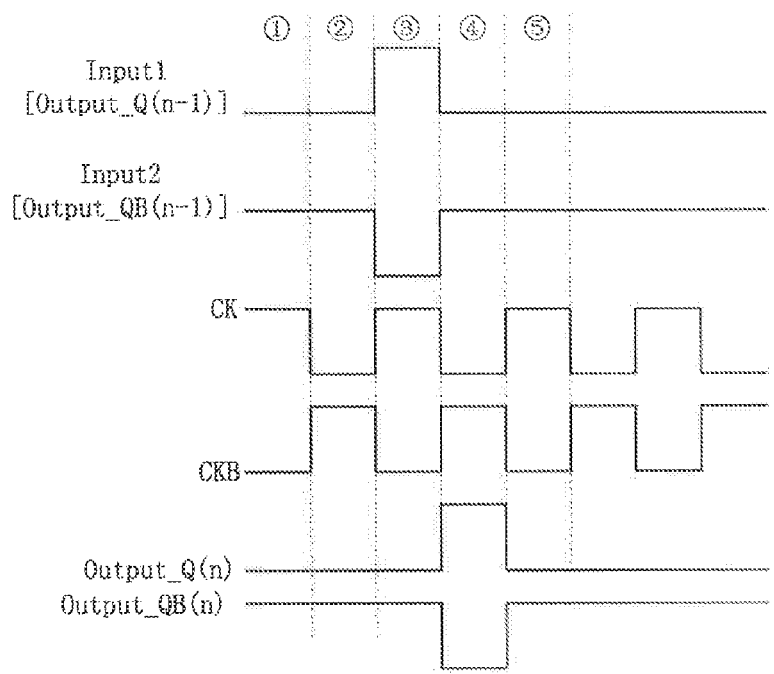
FIG. 6 is a voltage level timing diagram of the shift register at its operation according to the present invention.

Referring again to the operating voltage level timing diagram in FIG. 6, the working condition of the shift register during various phases according to the present invention is as follows (the following takes the example of the N-th stage shift register in the cascade structure for illustration):

Phase ①: the first output signal of the previous-stage shift register Output_Q(n−1) received by the first input signal end Input1 is at low level, and Output_QB(n−1) received by the second input signal end Input2 is at high level. Therefore the low level at Input1 switches off T5 and T7, while the high level at Input2 switches on T6; CK is at high level, and T1 is switched on, such that the latch unit latches the high level at the Input2 to make the non-inverting output at low level, and meanwhile the inverting output of the latch unit being at high level turns on T4, and it makes the non-inverting output of the present-stage shift register Output_Q(n) being pulled down to a low level; CKB being at low level at the same time switches off T2, and since T6 is switched on, the inverting output of the present-stage shift register Output_QB(n) is at high level.

Phase ②: CK is at low level, and T1 is switched off. CKB being at high level switches on T2. Since the non-inverting output of maintaining function of the latch unit is still at low level, T3 is switched off, while the inverting output of the latch unit is at high level, and T4 is switched on, which makes Output_Q(n) being pulled down to a low level. Meanwhile, the output of the previous-stage shift register Output_Q(n−1) is at low level, T5 and T7 are switched off. A high level at the Input2 switches on T6, and the inverting output of the present-stage shift register Output_QB(n) is at high level.

Phase ③: CK is at high level, CKB is at low level, T1 is switched on and T2 is switched off. Meanwhile the output of the previous-stage shift register Output_Q(n−1) jumps into a high level, and Output_QB(n−1) jumps into a low level, so T5 and T7 are switched on, and T6 is switched off. The non-inverting output of the present-stage shift register Output_Q (n) is pulled down to a low level, and Output_QB(n) is pulled up by T7 to a high level. T1 switching on makes the latch unit reversed by Input2, so the non-inverting output of the latch unit is at high level, while T2 is switched off, which makes the non-inverting output disconnected from T3, and the inverting output of the latch unit being at low level switches off T4.

Phase ④: CK is a low level. CKB is a high level, T1 is switched off and T2 is switched on. Due to the maintaining function of the latch unit, the non-inverting output of the latch unit is still at high level, and thus T3 is switched on. The output of the previous-stage shift register Output_Q(n−1) jumps into a low level, and Output_QB(n−1) jumps into a high level, so T5 and T7 are switched on, and T6 is switched off, while the inverting output of the latch unit being a low level makes T4 switched off. Thus, the non-inverting output of the present-stage Output_Q(n) is pulled up to a high level due to the switching on of T3, while T6 is switched on, so the inverting output of the present-stage shift register Output_QB (n) is at low level.

Phase ⑤: CK is at high level, CKB is at low level, T1 is switched on and T2 is switched off. The output of the previous-stage shift register Output_Q(n−1) is at low level, while Output_QB(n−1) is at high level, so T5 and T7 are switched off, and T6 is switched on. Because the input at Input2 makes the present-stage latch unit reversed again, the non-inverting output of the latch unit is at low level, and the inverting output of the latch unit is at high level, and thus T4 is switched on, and the non-inverting output of the present-stage shift register Output_Q(n) is pulled down to a low level, while T6 is switched on, and the inverting output of the present-stage shift register Output_QB(n) is at high level.

In the above-described manner, a shift register of the present invention realizes a shift output of the previous-stage output signal, and a gate driver circuit constituted of the shift registers which adopt such cascade structure can switch on the thin-film transistors in pixel units of each row on the array substrate in turn, therefore realizing the line-by-line scan of the display. In addition, due to simple circuit structure of the shift register according to the present invention and less signal wiring, GOA circuit formed by cascade structure of the above-described shift register occupies a small area, which can further reduce the occupied area of a panel, thus realizing high resolution and narrow border of the panel.

Figure 7:
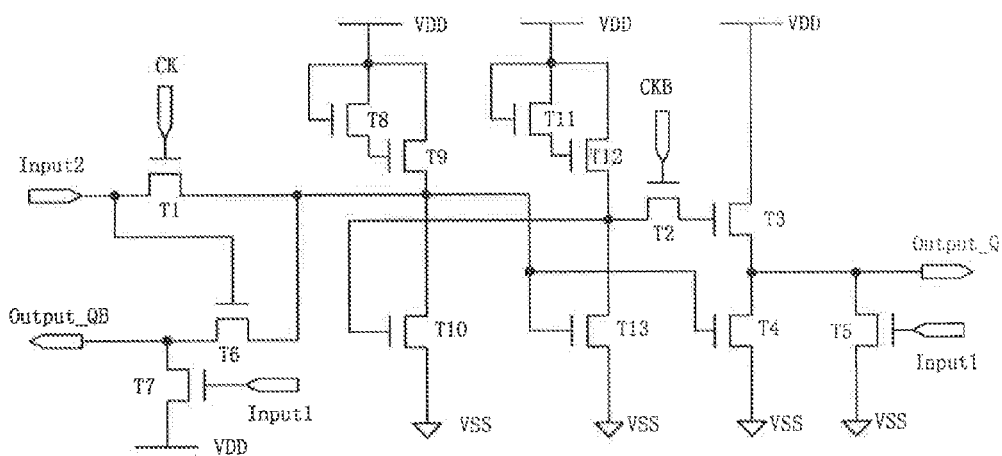
FIG. 7 is a diagram illustrating a detailed circuit structure of the latch unit in the shift register according to a first embodiment of the present invention.

In the first embodiment of the present invention, a latch unit in the shift register is also composed of two equivalent inverters, and the two inverters not only can be achieved by using a conventional CMOS process (for example, each inverter is constituted of a P-type thin-film transistor and a N-type thin-film transistor), but also can be achieved by using only NMOS or PMOS process (i.e. each inverter is constituted of only either N-type thin-film transistors or P-type thin-film transistors). When the two inverters are achieved by using only NMOS or PMOS process, one inverter can be constituted of per 3 thin-film transistors, and then two such inverters are connected to form a latch unit. In particular, a circuit structure of the latch unit formed by using N-type thin-film transistors is shown in FIG. 7. It is to be understand by a skilled person in the art that an N-type thin-film transistor is not the only form the latch unit can adopt, and when a P-type thin-film transistor is adopted, it is different only in the respect that the situation in which on and off states of the thin-film transistor are controlled by a gate level is opposite. With respect to the form of N-type thin-film transistor in FIG. 7, the specific connection structure thereof can be achieved without any inventive efforts, thus related descriptions are omitted herein due to space limitation.

Figure 8:
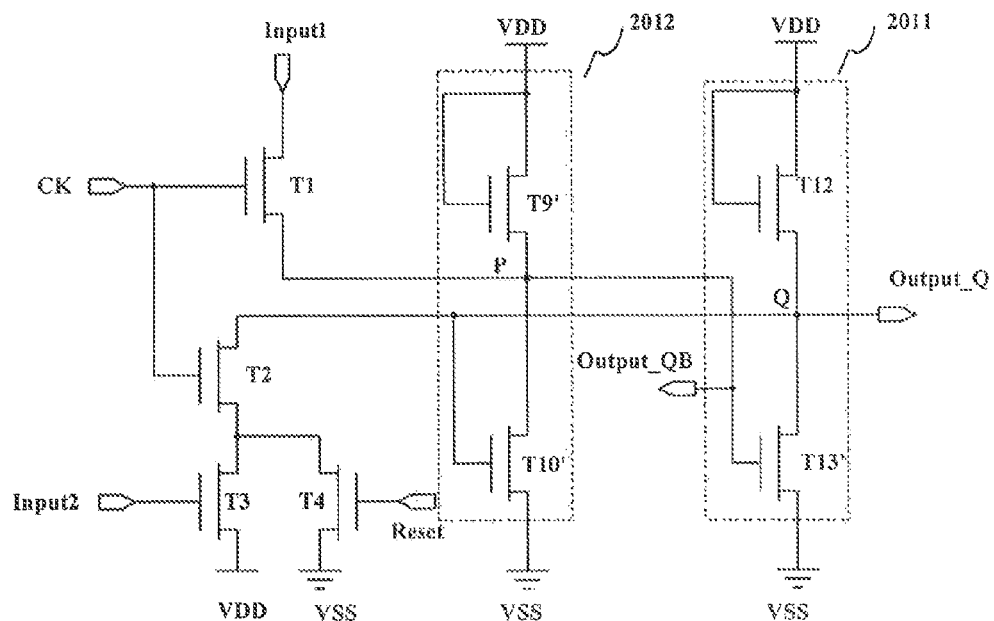
FIG. 8 is a diagram illustrating another detailed circuit structure of the latch unit in the shift register according to a first embodiment of the present invention.

In FIG. 7, a eighth to a thirteenth thin-film transistors T8-T13 equivalently form the latch unit in FIG. 4. Wherein the three thin-film transistors of the eleventh, twelfth, thirteenth thin-film transistors T11-T13 constitute the first inverter to form the non-inverting output signal of the latch unit; and the three thin-film transistors of the eighth, ninth, tenth thin-film transistors T8-T10 constitute the second inverter to form the inverting output signal of the latch unit. In particular, the gate of the thirteenth thin-film transistor T13 is connected to input end of the latch unit, and the source and the drain are respectively connected to the digital ground voltage VSS and the non-inverting output end of the latch unit; the gate of the tenth thin-film transistor T10 is connected to the non-inverting output end of the latch unit (i.e. the drain of T13), and the source and the drain are respectively connected to the digital ground voltage VSS and the inverting output end of the latch unit (according to the general structure of the latch, the input end of the latch unit is also directly connected to the inverting output end thereof). The drain of the ninth thin-film transistor T9 is connected to the operating voltage VDD, the gate is connected to the operating voltage VDD through the eighth thin-film transistor T8 (the eighth transistor T8 can also be omitted, i.e. the gate of T9 is connected to VDD directly, as shown in FIG. 8). and the source is connected to the inverting output end of the latch unit; the source and drain of the twelfth thin-film transistor T12 are respectively connected to the non-inverting output end of the latch unit and the operating voltage VDD, and the gate is connected to the operating voltage VDD through the eleventh thin-film transistor T11 (also, the eleventh thin-film transistor T11 can be omitted, i.e. the gate of T12 is connected to VDD directly, as shown in FIG. 8). The gate and the drain of the eleventh thin-film transistor T11 controlling the on and off states of the gate of T12 are both connected to the operating voltage VDD, and the source is connected to the gate of the twelfth thin-film transistor T12; the gate and the drain of the eighth thin-film transistor T8 controlling the on and off states of the gate of T9 are both connected to the operating voltage VDD, and the source is connected to the gate of the ninth thin-film transistor T9.

In order to reduce the number of the thin-film transistors, the first inverter and the second inverter according to the present invention can also be constituted of two thin-film transistors respectively. As shown in FIG. 8 (In FIG. 8, it further omits the fifth thin-film transistor of the output programming unit; and at the same time the sixth and seventh thin-film transistors of the inverting output unit are also omitted, the drain signal of T1 directly as the inverting output signal Output_QB), in addition to the first thin-film transistor T1 of the input programming unit and the second to fourth thin-film transistors T2-T4 of the output programming unit, the thin-film transistors T12' and T13' constitute the first inverter 2011, and the thin-film transistors T9' and T10' constitute the second inverter 2012. The gate of thin-film transistor T13' in the first inverter serves as the input end of the latch unit (Point P in the figure), the drain serves as non-inverting output end of the latch unit (Point Q in the figure), and the source is connected to the digital ground voltage end. The gate of thin-film transistor T10' in the second inverter is connected to the non-inverting output end of the latch unit, the drain serves as the inverting output end of the latch unit (Point P in the figure), and the source is connected to the digital ground voltage end. Moreover, in the first inverter, the gate and the drain of the thin-film transistors T12' are both connected to the operating voltage VDD, and the source is connected to the non-inverting output end of the latch unit; in the second inverter, the gate and the drain of the thin-film transistors T9' are both connected to the operating voltage VDD, and the source is connected to the inverting output end of the latch unit.

<Embodiment 2>

Figure 9:
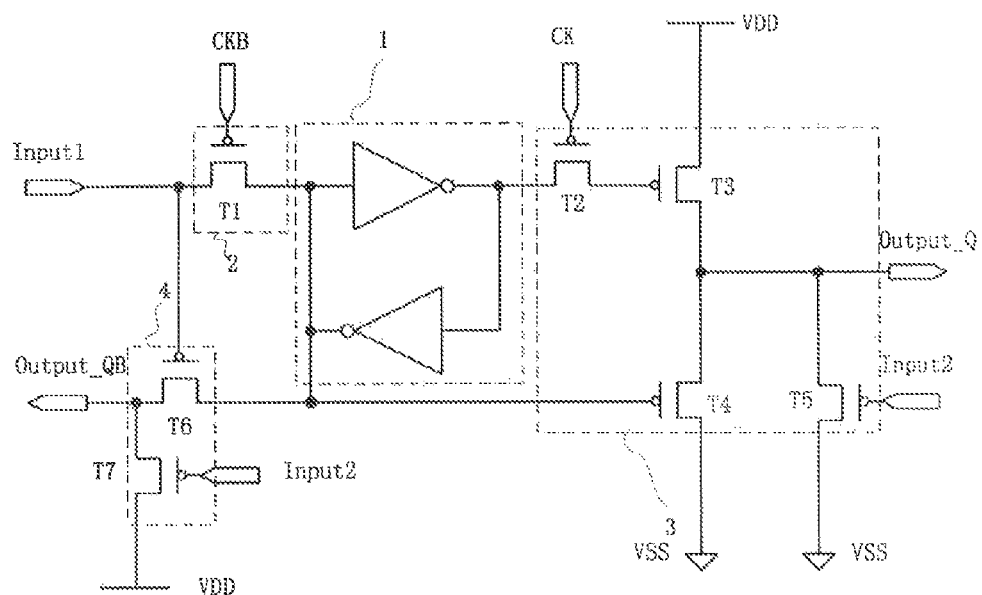
FIG. 9 is a diagram illustrating a circuit structure of the shift register constituted of P-type thin-film transistors according to a second embodiment of the present invention.

In a second embodiment of the present invention, the circuit structure of the shift register is shown in FIG. 9. In the second embodiment, except for the latch unit 1, the other thin-film transistors in the shift register T1-T7 are all P-type thin-film transistors. With respect to the first embodiment as shown in FIG. 4, the connection structure of the latch unit 1 as well as the input programming unit 2, the output programming unit 3 and the inverting output unit 4 in the second embodiment are essentially the same except that the two clock signals CK and CKB are exchanged, and the two input signals Input1 and Input2 are also exchanged in the second embodiment. The cascade structure of the gate driver constituted of the shift registers according to the second embodiment is the same as that shown in FIG. 5, and the circuit structure is unchanged; the timing diagram shown in FIG. 6 is still applicable except that the operation details during various phases should be correspondingly adjusted according to the transistor type (as well known by an ordinary skilled person in the art, the on and off operations of the P-type transistors under control of the gate level are different from those of the N-type transistors), but the actual on-off effects and the signal processing results are the same.

Besides the two implementations of the first embodiment as shown in FIG. 4 and the second embodiment as shown in FIG. 9, it can be understood by a skilled person in the art that a manner of combining the N-type thin-film transistors and the P-type thin-film transistors can also be applied to the present invention, the structure thereof can be implemented without any inventive efforts with respect to FIG. 4 or FIG. 9, and an explanation thereof is omitted herein due to space limitation.

A driver circuit in the embodiment of the present invention is an LTPS (Low Temperature Poly-silicon) or a-Si (Amorphous Silicon) Gate Drive on Array circuit (GOA), and also it can be an OLED (Original Light Emitting Diode) driver circuit.

Finally, the present invention further provides a display device, comprising the aforementioned driver circuit. Said display device can be any product and means with a display function such as liquid crystal panel, E-paper, OLED panel, liquid crystal TV, liquid crystal display, digital photo frame, mobile phone and tablet PC, etc.

In the present invention, the function of signal shift output is achieved only by using one latch unit, so the circuit structure is simple. the signal wiring is less, and the GOA circuit formed by the cascade structure thereof occupies a small area, thus further reducing the occupied area of the display panel, so as to realize the high resolution and narrow border of the display device. In addition, the shift register according to the present invention can be manufactured by using a plurality of processes, In addition to the currently compatible CMOS process (i.e. to form a structure comprising not only N-type thin-film transistors but also P-type thin-film transistors), it can be manufactured by using only either NMOS process or PMOS process to form a circuit structure in which only either N-type thin-film transistors or P-type thin-film transistors are used. Therefore, a plurality of flexible implementations are provided. With respect to the complicated CMOS process in the prior art, only either N-type thin-film transistors or P-type thin-film transistors can be used in the present invention to implement the circuit structure, and therefore only once NMOS process or PMOS process is needed, which can significantly reduce the process complexity and product cost.

The above implementations are only used for explaining the present invention, but not used for limiting the present invention. An ordinary skilled person in the related art could make various changes and modifications without deviating from spirit and scope of the present invention, so all the equivalent technical solutions also belong to the scope of the present invention, and the actual protection scope of the present invention should be defined by the appended claims.

What is claimed is:

1. A shift register, comprising:
an input programming unit, a latch unit, and output programming unit and an inverting output unit, wherein the input programming unit is connected to an input end of the latch unit to program the input end of the unit;
the latch unit being used for latching an output signal, and a non-inverting output end and an inverting output end of the latch unit being connected through the output programming unit;
the output programming unit having one input end connected to the non-inverting output end of the latch unit and another input end connected to the inverting output end of the latch unit for programming the output ends of the latch unit and generating an output signal of the register; and
the inverting output unit being connected to the inverting output end of the latch unit and being used for generating an inverting output signal of the shift register, wherein the input programming unit comprises a first thin-film transistor, a gate thereof being connected to a first clock signal end, a source being connected to an input signal end, and a drain being connected to the input end of the latch unit, and
the output programming unit comprises;
a second thin-film transistor, a third thin-film transistor, and a fourth thin-film transistor, wherein a gate of the second thin-film transistor being connected to a second clock signal end, a source and a drain being connected to the non-inverting output end of the latch unit and the gate of the third thin-film transistor respectively, a source and a drain of the third thin-film transistor being connected to a first output signal end and the operating voltage end respectively, a gate of the fourth thin-film transistor being connected to the inverting output end of the latch unit, and a source and a drain thereof being connected to the digital ground voltage end and the first output signal end respectively.

2. The shift register of claim 1, wherein the output programming unit further comprises:
a fifth thin-film transistor, a gate thereof being connected to a first input signal end, and a source and a drain being connected to the digital ground voltage end and the first output signal end respectively.

3. The shift register of claim 2, wherein the inverting output unit comprises:
a sixth thin-film transistor, a gate thereof being connected the input signal end, and a source and a drain being connected to the inverting output end and a second output signal end of the latch unit.

4. The shift register of claim 3, wherein the inverting output unit further comprises:
a seventh thin-film transistor, a gate thereof being connected to the first input signal end, and a source and a drain being connected to the operating voltage end and the second output signal end respectively.

5. The shift register according to claim 4, wherein the thin-film transistors therein are N-type thin-film transistors and/or P-type thin-film transistors.

6. The shift register of claim 1, wherein the second clock signal is an inverted signal of the first clock signal.

7. A gate driver, comprising:
a plurality of cascaded shift registers each of which comprises:
an input programming unit, a latch unit, an output programming unit and an inverting output unit, wherein the input programming unit is connected to and input end of the latch unit to program the input end of the latch unit;
the latch unit being used for latching an output signal, and a non-inverting output end and an inverting output end of the latch unit being connected through the output programming unit;
the output programming unit being connected to the output end of the latch unit to program the output end of the latch unit; and
the inverting output unit being connected to the inverting output end of the latch unit and being used for generating an inverting output signal of the shift register, wherein the input programming unit comprises a first thin-film transistor, an gate thereof being connected to a first clock signal end, a source being connected to an input signal end, and a drain being connected to the input end of the latch unit, and the output programming unit comprises:

a second thin-film transistor, a third thin-film transistor, and a fourth thin-film transistor, wherein a gate of the second thin-film transistor being connected to a second clock signal end, a source and a drain being connected to the non-inverting output end of the latch unit and the gate of the third thin-film transistor respectively, a source and a drain of the third thin-film transistor being connected to a first output signal end and the operating voltage end respectively, a gate of the fourth thin-film transistor being connected to the inverting output end of the latch unit, and a source and a drain thereof being connected to the digital ground voltage end and the first output signal end respectively.

8. The gate driver according to claim 7, wherein in the gate driver:

a first input signal end of the first-stage shift register being connected to an initial starting signal, and a second input signal end being connected to an inverted signal of the starting signal; and except for the first-stage shift register, the first input signal ends of the shift registers for the other stages being connected to the first output signal end of the previous-stage shift register, and the second input signal end being connected to the second output signal end of the previous-stage shift register.

9. A display device, wherein the display device comprising a color film substrate, an array substrate, and a liquid crystal cell, wherein the gate driver according to claim 7 is integrated in the array substrate.

10. The shift register of claim 1, wherein the latch unit comprises a first inverter and a second inverter connected end to end.

11. The shift register of claim 10, wherein the second inverter comprises:

an eighth thin-film transistor, a gate and a drain thereof both being connected to the operating voltage end, and a source connected to the gate of the ninth thin-film transistor; and a ninth thin-film transistor, a drain thereof being connected to the operating voltage end, and a source being connected to the input end and the inverting output end of the latch unit.

12. The shift register of claim 10, wherein the second inverter further comprises:

a tenth thin-film transistor, a gate thereof being connected to the non-inverting output end of the latch unit, a drain serving as the inverting output end of the latch unit, and a source being connected to the digital ground voltage end.

13. The shift register of claim 11, wherein the first inverter in the latch unit comprises:

an eleventh thin-film transistor, a gate and a drain thereof both being connected to the operating voltage end, and a source being connected to the gate of the twelfth thin-film transistor; and a twelfth thin-film transistor, a drain thereof being connected to an operating voltage end, and a source being connected to the non-inverting output end of the latch unit.

14. The shift register of claim 12, wherein the first inverter in the latch unit further comprises:

a thirteenth thin-film transistor, a gate thereof serving as the input end of the latch unit, a drain serving as the non-inverting output end of the latch unit, and a source being connected to a digital ground voltage end.

15. The shift register of claim 14, wherein the first inverter in the latch unit further comprises:

a twelfth thin-film transistor, a gate and a drain thereof being connected to an operating voltage end, and a source being connected to the non-inverting output end of the latch unit; and wherein the second inverter further comprises:

a ninth thin-film transistor, a gate and a drain thereof both being connected to the operating voltage end, and the source being connected to the input end and the inverting output end of the latch unit.

* * * * *